United States Patent [19]
Kent et al.

[11] Patent Number: 5,365,399
[45] Date of Patent: Nov. 15, 1994

[54] HEAT SINKING APPARATUS FOR SURFACE MOUNTABLE POWER DEVICES

[75] Inventors: Kevin L. Kent, Woodstock; Jacqueline D. Glomski, Arlington Heights, both of Ill.

[73] Assignee: Motorola, Inc., Schaumburg, Ill.

[21] Appl. No.: 923,636

[22] Filed: Aug. 3, 1992

[51] Int. Cl.$^5$ .............................................. H05K 7/20
[52] U.S. Cl. .................... 361/704; 165/80.3; 165/185; 174/16.3; 257/712; 361/702
[58] Field of Search ............. 165/86.3, 185; 174/16.3, 35 R; 257/712; 361/383, 386–389, 424

[56] References Cited

U.S. PATENT DOCUMENTS

| | | | |
|---|---|---|---|
| 3,786,317 | 1/1974 | Thierfelder | 357/81 |
| 3,972,062 | 7/1976 | Hopp | 357/81 |
| 4,147,889 | 4/1979 | Andrews et al. | 361/388 |
| 4,504,886 | 3/1985 | Cygan et al. | 361/386 |
| 4,945,451 | 7/1990 | Gohl et al. | 361/386 |
| 4,970,579 | 11/1990 | Arldt et al. | 357/81 |
| 5,031,028 | 7/1991 | Galich et al. | 174/163 |

OTHER PUBLICATIONS

Research Disclosure, Jan. 1991, No. 321, Kenneth Mason Publications Ltd, England, p. 1, entitled "Soft-Metal Interfaced Heatsinks For Air–Cooled Electronics Packager".

*Primary Examiner*—Gregory D. Thompson
*Attorney, Agent, or Firm*—Timothy W. Markison; Steven G. Parmelee

[57] ABSTRACT

A heat sinking apparatus that dissipates heat generated by a surface mountable power device, which can be auto picked and placed, comprises a first planar surface, at least one gull wing mounting tab, and at least one connective leg. The at least one connective leg thermally couples the first planar surface to the gull wing tab and all three structures are comprised of a thermally conductive material. When the heat sinking apparatus is coupled to a substrate, heat generated by the surface mountable power device is thermally transferred through a thermal plane of the substrate to the heat sinking apparatus.

2 Claims, 1 Drawing Sheet

HEAT SINKING APPARATUS FOR SURFACE MOUNTABLE POWER DEVICES

FIELD OF THE INVENTION

This invention relates generally to heat sinks and in particular to a heat sinking apparatus that is used to dissipate heat generated by a surface mountable power device.

BACKGROUND OF THE INVENTION

It is well known that printed circuit (PC) boards used in electronic devices can be miniaturized by using surface mountable devices. Most electronic components such as capacitors, resistors, inductors, diodes, transistors, etc, are readily available in surface mountable packages. As is also known, surface mountable power devices, such as power diodes and transistors, generate heat which, if not dissipated, could destroy the component. One common approach to protect the surface mountable power device from overheating is to use the ground plane, or similar thermally conductive area, of the PC board as a heat sink. This typically provides adequate dissipation of the heat generated, but requires a relatively significant amount of board space which increases the size of the PC board.

An alternative to using the PC board as a heat sink is to use larger packages than a surface mountable package. Such larger packages, such as a TO-220 or a TO-218 package, usually have a through mounting hole which can be mounted to a separate heat sink. This approach provides greater heat dissipation than the abovementioned ground plane approach, however, it is not without costs. One disadvantage of using separate heat sinks is the amount of board space required. With such a large amount of board space required, optimum miniaturization of an electronic component cannot be realized. Another disadvantage is that the heat sink assembly has to be soldered to the PC board after the majority of the board has been wave soldered. As is known, post wave solder assembly, such as is required with separate heat sinks, consistently produce a higher defect rate than PC board without such assemblies. Therefore, a need exists for a heat sinking apparatus that provides adequate heat dissipation for surface mountable power devices and overcomes the above mentioned problems.

SUMMARY OF THE INVENTION

These needs and others are substantially met by the heat sinking apparatus for surface mountable power devices disclosed herein. For a surface mountable power device that is thermally coupled to a thermal plane of a substrate and wherein the surface mountable power device has a predetermined package size, the heat sinking apparatus comprises a first planar surface, at least one gull wing mounting tab, and at least one connective leg. The first planar surface has a predetermined surface area such that the part can be auto picked and placed. The at least one connective leg, which has a predetermined length, thermally and physically couples the first planar surface to the at least one gull wing mounting tab. The first planar surface, the at least one gull wing mounting tab, and the at least one connecting leg are comprised of a thermally conducted material. With the heat sinking apparatus placed over the surface mountable power device such that at least part of the surface mountable power device is enclosed by the heat sinking apparatus, a substantial portion of the heat generated by the surface mounted power device is thermally transferred through the thermal plane of the substrate to the heat sinking apparatus.

DESCRIPTION OF A PREFERRED EMBODIMENT

Generally, the present invention incorporates a heat sinking apparatus that provides heat dissipation for surface mountable power devices. By having a geometric shape slightly larger than the surface mountable power device, the heat sinking apparatus can be auto-pick and placeable, thus eliminating the need for post wave solder assembly. The heat produced by the surface mountable power device is thermally coupled through the ground plane of the PC board to the heat sinking apparatus and is dissipated. Because the heat sinking apparatus is dissipating a substantial portion of the heat, the required board space is substantially less than when the PC board is providing a substantial portion of the heat dissipation. In addition, the heat sinking apparatus can provide additional thermal dissipation by attaching a clip-on heat sinking extension to it.

Figure 1:
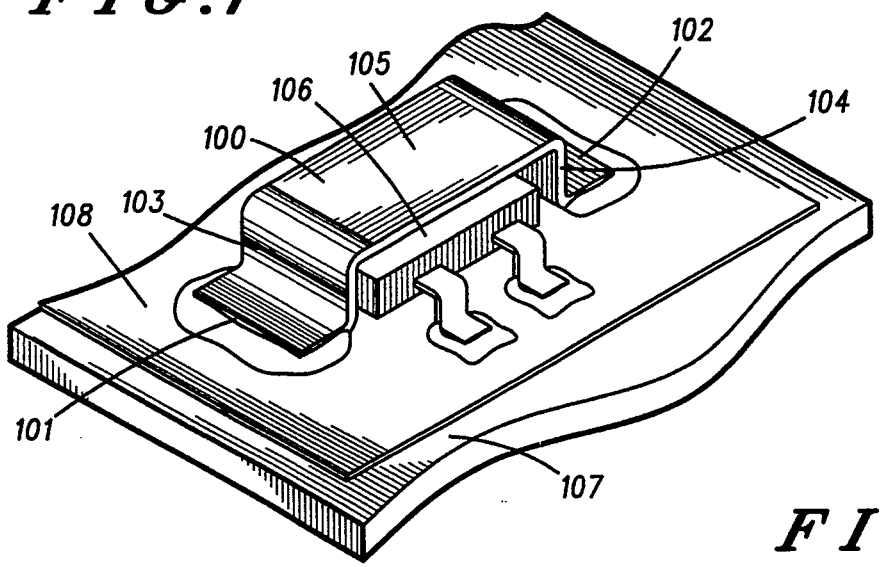
FIG. 1 illustrates an isometric view of a heat sink encasing a surface mountable power device as is contemplated by the present invention.

The present invention can be more fully understood with reference to FIGS. 1–4. FIG. 1 illustrates the heat sinking apparatus 100, a surface mountable power device 106, and a substrate 107. The substrate 107 comprises a ground plane, or thermal plane, 108. The thermal plane 108 is fabricated of a thermally conductive material, such as copper, and is deposited on the substrate, or PC board, 107 in a known manner, thus no further discussion of the thermal plane construction or composition will be presented. The heat sinking apparatus 100, which is constructed of a thermally conductive material, such as copper or aluminum, comprises a first gull wing mounting tab 101, a second gull wing mounting tab 102, a first connective leg 103, a second connective leg 104, and a first planar surface 105.

The first and second gull wing tabs 101 and 102 are thermally and physically connected to the first planar surface 105 by the first and second connective legs 103 and 104. The first planar surface 105 is substantially parallel to the first and second gull wing tabs 101 and 102, but is on a different plane. The first and second connective legs 102 and 103 are shown as being substantially perpendicular to the first and second gull wing tabs 101 and 102 and the first planar surface 105, however, any angle may be used or the legs may be rounded. In actuality, the geometric shape of the connective legs is immaterial provided that they have enough mass to dissipate heat and provide sufficient distance between the first planar surface and the gull wing tabs such that the heat sinking apparatus can be placed over a surface mountable power device.

The geometric shape of the first planar surface 105 and the first and second gull wing tabs 101 and 102 are shown to be of a rectangular shape, however, such a shape is not critical. For example, the gull wing tabs could be rounded, square, semi-circles, etc, while the first planar surface could be square, round, etc. The key physical features of the gull wing tabs is that they provide a sufficient base (at least 0.060 in.×0.100 in.) and soldering area such that the heat sinking apparatus can be reflow soldered to the PC board. The key physical feature of the first planar surface is that it has sufficient size and flatness such that a pick and place device has an adequate surface to grab. At a minimum, standard pick and place apparatus requires a 0.1 in.×0.1 in. area to pick a pan, thus, the dimensions of the first planar surface 105 should exceed this minimum.

The components of the heat sinking apparatus have been described separately above, however, it is contemplated that the entire heat sinking apparatus 100 will be molded or formed from one piece of thermally conductive material, such as copper or aluminum. The physical dimensions of the heat sinking apparatus will vary based on the surface mountable power device it is heat sinking. At a minimum, the inside dimensions have to exceed the package size of the surface mountable power device. At a maximum to ensure that the heat sinking apparatus can be auto pick and placeable, (i.e. doesn't weigh too much) the inside dimensions should not exceed three times the predetermined package size of the surface mountable power device. For example, assume the package size of the surface mountable power device 106 is 0.265 in. wide, 0.445 in. long, and 0.100 in. high. Thus, the dimension between the gull wing tabs should be in the range of 0.45 to 1.1 inches, the dimension between the gull wing tabs and the first mounting surface should be in the range of 0.11 to 0.35 inches, and the length of the gull wing tabs, the first planar surface, and the connecting legs should be in the range of 0.27 to 0.80 inches.

Figure 2:
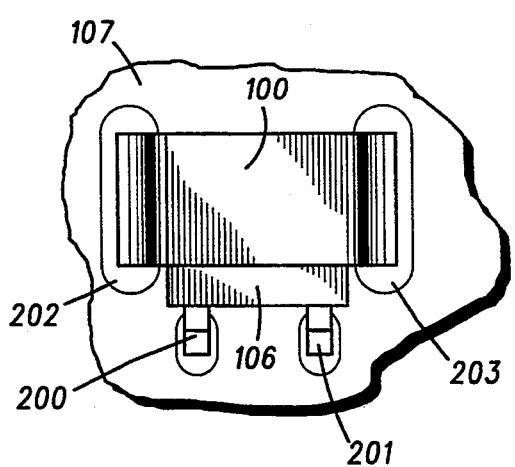
FIG. 2 illustrates a top and front view of a heat sink encasing a surface mountable power device as is contemplated by the present invention.

FIG. 2 illustrates a front and top view of the heat sinking apparatus and surface mountable power device of FIG. 1. FIG. 2 further illustrates the relationship between the heat sinking apparatus 100 and the surface mountable power device 106. Also shown are several solder pads 200–203 which are deposited on the PC board and having a solderable paste applied to them. The solder pads 200–203 provide both physical and thermal coupling of the heat sinking apparatus to the ground plane of the substrate. Once the heat sinking apparatus has been automatically placed in position, the PC board can be reflow soldered to adhere the heat sinking apparatus to it. Auto picking and placing may be accomplished with robotic placement, high speed gantry placement and high speed turret chip placement equipment.

Figure 3:
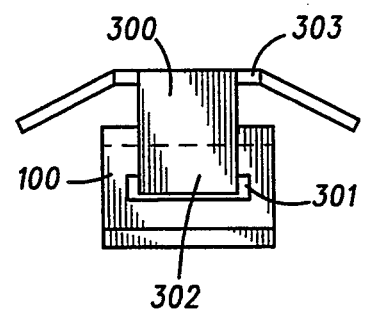
FIG. 3 illustrates a heat sink having a clip on heat extension as contemplated by the present invention.
Figure 4:
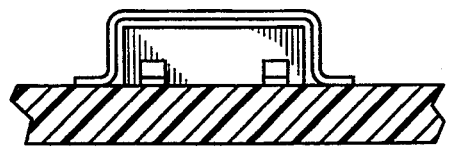
FIG. 4 illustrates an alternative embodiment of a heat sink having a clip on heat sink extension as contemplated by the present invention.
Figure 4:
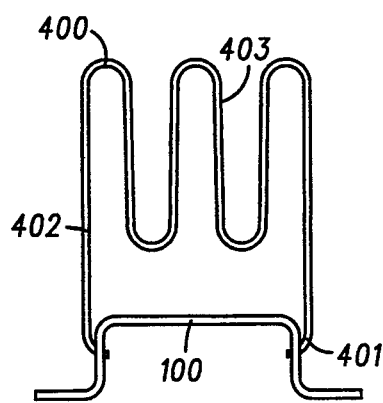

FIGS. 3 and 4 illustrate a spring clip heat sink extension coupled 300 and 400 to the heat sinking apparatus 100. The heat sinking apparatus 100 has slots 301 and 401 cut into the first and second connective leg. The slots 301 and 401 provide an aligning and holding mechanism for the spring clip heat sink extension 300. The heat sink extension may have various geometric shapes, such as the ones shown if FIGS. 3 and 4, and may be extruded, casted, or fabricated from a heat dissipating material, such as copper or aluminum. Once the heat sinking extension has been clipped into place, it is held there by its spring force or may be permanently soldered to the heat sinking apparatus.

The heat sink extension 300 of FIG. 3 comprises connective legs 302 and a dissipative surface 303. The heat sink extension 400 of FIG. 4 comprises connective legs 402 and a curved dissipative surface. As with the heat sinking apparatus, the heat sink extensions of FIGS. 3 and 4 the components have been described separately, however, it is contemplated that the entire heat sink extension will be molded or formed from one piece of thermally conductive material, such as copper or aluminum.

As described thus far, the heat sinking apparatus has two gull wing tabs for mounting to a PC board, however, it may have more or less tabs. If, for example, the heat sinking apparatus has four gull wing mounting tabs, the heat sinking apparatus can full encase a surface mountable power device and provide RF shielding as well as thermal dissipation. Additionally, the geometric shape of the heat sinking apparatus and the heat sink extension can be of almost any design and should not be limited to the few examples described above.

We claim:

1. A heat sinking apparatus for use with a surface mountable power device, wherein the surface mountable power device is thermally coupled to a thermal plane of a substrate and wherein the surface mountable power device has a predetermined package size, the heat sinking apparatus comprises:

a first planar surface having a predetermined surface area;

at least a first gull-wing mounting tab and second gull-wing mounting tab, wherein the at least a first gull-wing mounting tab and second gull-wing mounting tab are substantially parallel to the first planar surface and are on a different plane than the first planar surface;

at least a first connective leg and second connective leg, each having a predetermined length and each having a slot of predetermined dimensions, the first connective leg and the second connective leg are thermally and physically coupled to the first planar surface and the at least a first gull-wing mounting tab and second gull-wing mounting tab; wherein the first planar surface, the at least a first gull-wing mounting tab and second gull-wing mounting tab, and the first connective leg and second connective leg are comprised of a thermally conductive material such that the heat sinking apparatus is auto pick and placeable on the substrate with the first planar surface being substantially parallel to the substrate, wherein inner dimensions of the heat sinking apparatus are in the range of at least as great as the predetermined packaged size of the surface mountable power device and less than three times the predetermined package size such that the surface mountable power device is at least partially encased by the heat sinking apparatus, and such that a substantial portion of heat generated by the surface mountable power device is thermally transferred through the thermal plane of the substrate to the heat sinking apparatus, and a clip-on heat sink extension having a predetermined geometric shape that mates with the slots of the at least a first connective leg and second connective leg such that the heat sinking apparatus provides further heat dissipation for the surface mountable power device.

2. A method for heat sinking a surface mountable power device that is thermally coupled to a thermal plane of a substrate, the method comprises the steps of:
   a) fabricating a heat sinking apparatus that has a first planar surface, first and second gull-wing mounting tabs and first and second connective legs, wherein the first and second connective legs are thermally and physically coupled to the first and second gull-wing mounting tabs and the first planar surface;
   b) auto picking and placing the heat sinking apparatus onto the substrate such that the heat sinking apparatus at least partially encases the surface mountable power device;
   c) securing the heat sinking apparatus into position such that a substantial portion of heat generated by the surface mountable power device is thermally transferred through the thermal plane of the substrate to the heat sinking apparatus
   d) fabricating a slot having predetermined dimensions in each of the first and second connective legs; and
   e) clipping on a heat sink extension having a predetermined geometric shape to the slots of the first and second connective legs such that the heat sinking apparatus provides further heat dissipation for the surface mountable power device.

* * * * *